INVENTOR
Alfred Ertel
BY Kenneth R. Glaser
ATTORNEY

Fig. 3
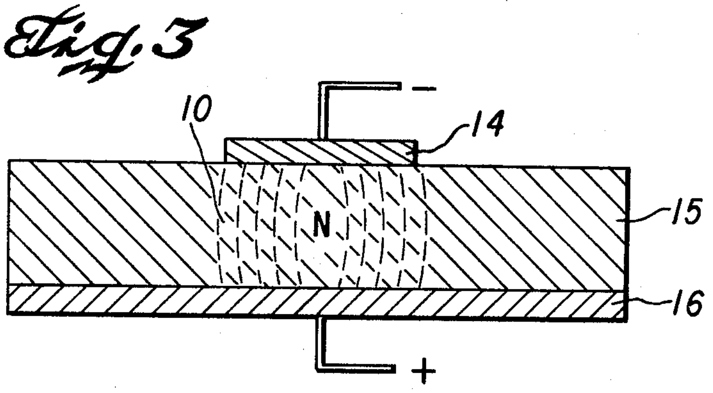
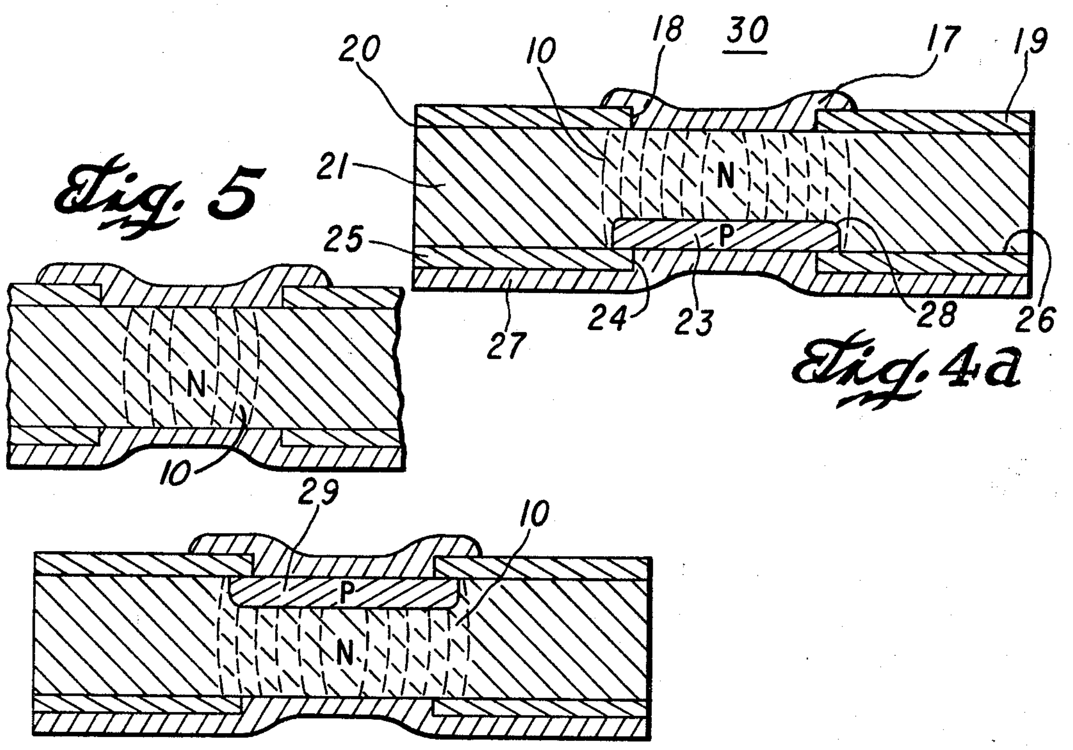
Fig. 5, Fig. 4a
Fig. 4b
INVENTOR
Alfred Ertel
BY Kenneth B. Glaser
ATTORNEY

United States Patent Office 3,432,778
Patented Mar. 11, 1969

3,432,778

SOLID STATE MICROSTRIPLINE ATTENUATOR

Alfred Ertel, Dallas, Tex., assignor to Texas Instruments Incorporated, Dallas, Tex., a corporation of Delaware Filed Dec. 23, 1966, Ser. No. 604,301
U.S. Cl. 333—81
Int. Cl. H01p *1/22*
9 Claims

ABSTRACT OF THE DISCLOSURE

A microwave stripline attenuator is disclosed including a semiconductor substrate having a metallic stripline on one surface and a metal ground plane on an opposite surface. A diffused junction or a Schottky-barrier junction is formed at one surface of the substrate, and means are coupled to the junction to establish a selectively variable bias across the junction, thereby varying the resistivity of the substrate so that transmitted microwave signals are variably attenuated by changes in the bias across the junction.

This invention relates to semiconductor devices and more particularly to a semiconductor stripline attenuator for microwave applications.

Along with the increased usage of semiconductor devices in microwave circuits, there has been an increase in the use of planar microstrip transmission lines. Such a transmission line may be comprised of a semiconductor substrate (which contains semiconductor circuit components) as the dielectric between the metallic stripline on one surface of the substrate and the metallic ground plane on the opposite surface. In certain microwave applications there is often the need of attenuating an RF signal propagating down a transmission line. An example of one such need is in controlling the input power level to a microwave amplifier whose amplification characteristic is linear with frequency only over a certain input power range.

Therefore, an object of this invention is a semiconductor microstripline attenuator for use at microwave frequencies.

Another object of the invention is a semiconductor microstripline attenuator that changes the attenuation of an RF signal by a change in the voltage bias of a semiconductor junction.

Figure 1:
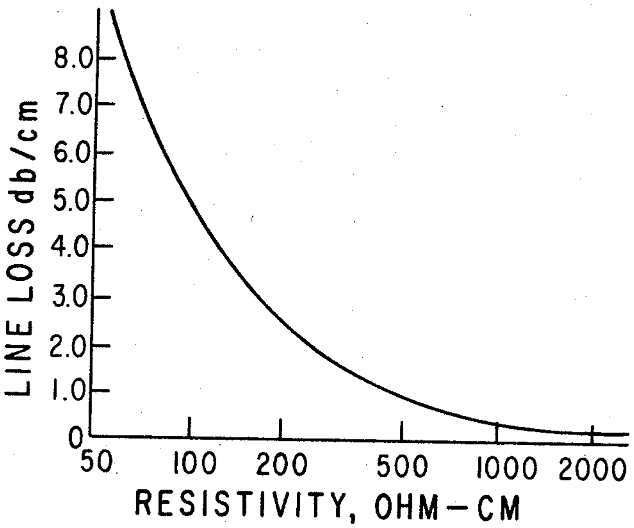
Figure 2A:
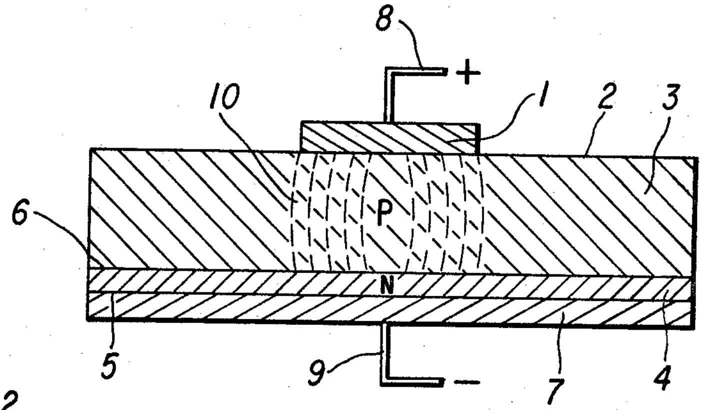
Figure 2B:
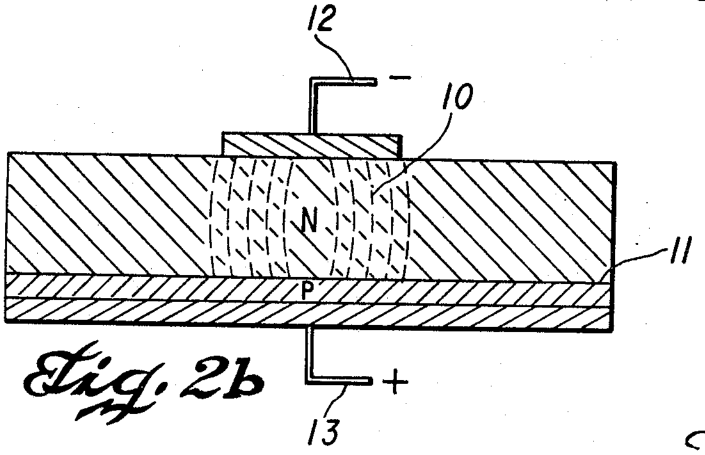

The novel features believed to be characteristic of this invention are set forth in the appended claims. This invention itself, however, as well as other objects and advantages thereof, may best be understood by reference to the following detailed description when read in conjunction with the accompanying drawings, wherein:

FIGURE 1 is a graph illustrating the microstripline loss as a function of the dielectric resistivity of a silicon substrate;

FIGURES 2*a* and 2*b* are sectional views of attenuating devices using diffused junctions in both N- and P-conductivity type semiconductor substrates;

FIGURE 3 is a sectional view of an attenuating device using a Schottky-barrier junction in a semiconductor substrate;

FIGURES 4*a* and 4*b* are sectional views of portions of integrated circuits with diffused junction attenuating components in semiconductor substrates, and FIGURE 5 is a partial sectional view of a portion of an integrated circuit having a Schottky-barrier junction attenuating component in a semiconductor substrate.

When a semiconductor is used as the dielectric for a microstrip transmission line, the microstripline loss is inversely proportional to the resistivity of the semiconductor. The resistivity of a semiconductor body, in turn, depends on the number of free carriers available in the body. If additional carriers are available in the body, its apparent resistivity will decrease. Carrier concentration may be either increased or decreased by the presence of a junction in the semiconductor body which can be controlled by controlling the voltage bias of the junction. This invention utilizes a biased semiconductor junction in a silicon substrate which is located between a microstripline and a ground plane. The propagation properties of the microstripline can be attenuated by increasing the forward bias of the junction and improved by decreasing the forward bias or by reverse biasing the junction.

Referring now to the figures of the drawings, FIGURE 1 shows a graph illustrating the relationship of the microstripline loss in db/cm. of stripline length to the resistivity of a silicon substrate in ohm-cm. For example, using 1600 ohm-cm. silicon, the line loss is 0.35 db/cm. at 500 mHz. at room temperature. By increasing the carrier concentration, the resistivity of the substrate can be decreased to 100 ohm-cm., for example, thereby increasing microwave propagation loss to about 5.0 db/cm. at 500 mHz. at room temperature. By forward biasing a semiconductor junction as will be explained in conjunction with the following figures, the apparent resistance (resistance which the propagating microwave signal "sees") of the silicon substrate can be varied by varying the forward bias, thus varying the attenuation of the microstripline.

FIGURE 2*a* illustrates one embodiment of the attenuating device of the invention. A stripline 1 of a metal such as gold or aluminum, for example, is formed by commonly known techniques in the semiconductor industry on a portion of one surface 2 of a substrate 3 of semiconductor material. Silicon, a fair dielectric, may be used for microwave applications. In this illustration the substrate 3 is P-conductivity type silicon which has had an N-conductivity type region 4 formed in the substrate from the opposite surface 5 by conventional diffusion techniques, thus forming the PN junction 6. A ground plane 7 of aluminum, for example, is formed over the entire substrate surface 5.

When the PN junction 6 is forward biased by the application of a positive DC voltage at terminal 8 in relationship to terminal 9, carriers are injected into the P-conductivity type substrate which lowers the apparent resistivity of the substrate. The DC current flow between the stripline 1 and ground plane 7 due to the forward bias is indicated generally by the dashed lined area 10 in FIGURE 2*a* and subsequent figures. The reduction in the apparent resistivity of the substrate 3 increases the microwave power loss, thereby attenuating the microwave signal propagating down the stripline 1. It should be obvious at this point that by varying the DC bias of the PN junction 6 the attenuation is also varied.

An attenuator using an N-conductivity type substrate instead of P-conductivity type is shown in FIGURE 2*b*. The PN junction 11 is forward biased by applying a voltage between terminal 12 and terminal 13 such that terminal 12 is at a negative potential in respect to terminal 13. Again, as with the attenuator shown in FIGURE 2*a*, the attenuation of the device can be varied by varying the bias between the terminals 12 and 13.

Instead of a diffused junction as shown in FIGURE 2*a* and 2*b*, a Schottky-barrier junction can be used as shown in FIGURE 3. A Schottky-barrier junction is formed by the non-ohmic contact between a metal and a semiconductor. A metal stripline 14 is formed on an N-conductivity substrate 15. By the use of such a metal as molybdenum for the ground plane 16, or by depositing aluminum in a manner well known in the semiconductor art on the substrate 15, a nonohmic contact between the metal ground plane 16 and the substrate 15 is formed which will act as a Schottky-barrier junction. The junction is forward biased as was the diffused junction shown in FIGURE 2*b*.

When a microstripline variable attenuator is used in an integrated circuit instead of as a discrete device as shown in the previous figures, the attenuator is formed in the substrate as shown in FIGURE 4*a* which illustrates a portion of an integrated circuit. For the sake of simplicity, only the attenuating component 30 is shown positioned at a desired location along an integrated circuit microstripline 17. A window 18 in the silicon oxide layer 19 is formed by conventional methods to enable the stripline 17 to make contact with one face 20 of the silicon substrate 21. A diffused P-conductivity type region 23 is formed through the window 24 in the silicon oxide layer 25 on the opposite face 26 of the substrate 21 by standard methods. The window 24 allows contact of the metallic ground plane 27 to the diffused region 23. The PN junction 28 formed between the diffused region 23 and the substrate 21 is forward biased by making the ground plane 27 more positive in respect to the microstripline 17. By varying the forward bias the attenuator 30 can variably attenuate any signal propagating down the stripline 17.

FIGURE 4*b* illustrates the fact that the diffused region 29 can be formed adjacent the stripline, as in FIGURE 4*b*, instead of adjacent the ground plane, as in FIGURE 4*a*. FIGURE 5 illustrates a microstripline variable attenuator in integrated circuit form using a Schottky-barrier junction such as shown in FIGURE 3. This junction can be formed either adjacent the stripline or the ground plane in the manner described above in connection with the FIGURE 3 embodiment. In addition, it should be obvious that the Schottky-barrier junction shown in FIGURE 3 can also be formed adjacent the stripline instead of adjacent the ground plane.

Although preferred embodiments of the invention have been described in detail, it is to be understood that various changes, substitutions, and alterations can be made therein without departing from the spirit and scope of the invention as defined by the appended claims.

What is claimed is:

1. A semiconductor microwave stripline attenuator comprising:

semiconductor substrate of one conductivity type, a metallic stripline on one surface of said substrate, a diffused region of opposite conductivity type in said substrate adjacent the opposite surface of said substrate, thereby forming a PN junction between said region and said substrate, a metallic ground plane on said opposite surface of said substrate, and means coupled to said ground plane for establishing a selectively variable bias across said junction to vary the resistivity of said substrate whereby transmitted microwave signals are variably attenuated by changes in the bias across said junction.

2. A microwave stripline attenuator comprising:

a semiconductor body having a PN junction therein, means coupled to said junction for establishing a selectively variable bias thereacross to control the concentration of charge carriers in said semiconductor body, thereby controlling the resistivity of said semiconductor body, a metallic ground plane on a surface of said body, and a metallic stripline on the opposite surface of said body overlying said PN junction.

3. The semiconductor microwave stripline attenuator as defined by claim 1, wherein said diffused region in said substrate is adjacent said one surface of said substrate, said region being adjacent said stripline and said means for establishing a selectively variable bias across said junction is coupled to said stripline.

4. A semiconductor microwave stripline attenuator, comprising:

a semiconductor substrate of one conductivity type, a metallic stripline on one surface of said substrate, a metal ground plane on the opposite surface of said substrate, said ground plane comprising a predetermined metal to form a nonohmic contact with said substrate so as to define a Schottky-barrier junction between said ground plane and said substrate, and means coupled to said junction for establishing a selectively variable bias across said junction to vary the resistivity of said substrate so as to variably attenuate microwave signals propagating down said stripline in accordance with variations in the bias across said junction.

5. The semiconductor microwave stripline attenuator as defined in claim 4, wherein said semiconductor substrate comprises silicon and said metallic stripline comprises a predetermined metal so that said Schottky-barrier junction is formed between said stripline and said substrate.

6. A microswave stripline attenuator adapted for incorporation in an integrated circuit, comprising:

a semiconductor substrate of one conductivity type, a first insulating layer on one surface of said substrate, said first insulating layer having a first window exposing a portion of said substrate, a stripline on said first insulating layer, a portion of said stripline making contact with said substrate through said first window, a diffused region of opposite conductivity type in said substrate adjacent the opposite surface of said substrate, thereby forming a PN junction between said substrate and said region, said diffused region being aligned with said first window in said insulating layer, a second insulating layer on said opposite surface of said substrate with a second window therein exposing a portion of said region, a metallic ground plane making contact with said substrate through said second window, and means coupled to said junction for establishing a selectively variable bias across said junction to vary the resistivity of said substrate whereby microwave signals propagating down said stripline are variably attenuated by variations in the bias across said junction.

7. The microwave stripline attenuator defined in claim 6 wherein said region is adjacent said one surface of said substrate.

8. A microwave stripline attenuator adapted for incorporation in an integrated circuit, comprising:

a semiconductor substrate of one conductivity type, a first insulating layer having a first window on one surface of said substrate, said first window exposing a portion of said substrate, a stripline on said first insulating layer, a portion of said stripline making contact with said substrate through said first window, a second insulating layer on the opposite surface of said substrate having a second window exposing a portion of said substrate, said second window being aligned with said first window, a metallic ground plane on said second insulating layer, a portion of said metallic ground plane making contact with said opposite surface of said substrate through said second window, said metallic ground plane forming a Schottky-barrier junction between said substrate and said metallic ground plane, and means coupled to said junction for establishing a selectively variable bias across said junction to vary the resistivity of said substrate so as to variably attenuate microwave signals propagting down said stripline in accordance with variations in the bias across said junction.

9. The microwave stripline attenuator as defined in claim 8, wherein said Schottky-barrier junction is formed between said stripline and said substrate.

References Cited

UNITED STATES PATENTS

| | | |
|---|---|---|
| 2,934,723 | 4/1960 | Hewitt. |
| 3,351,698 | 11/1967 | Marinace. |

OTHER REFERENCES

McIver, G. W.: A Traveling-Wave Transistor, Proc. of the IEEE, November 1965, pp. 1747, 1748.

Uhlir, A., Jr.: Microwave Applications of Integrated-Circuit Techniques, Proc. of the IEEE, December 1964, pp. 1617–1623.

E. LIEBERMAN, *Primary Examiner.*

PAUL L. GENSLER, *Assistant Examiner.*

U.S. Cl. X.R.

317—234